(12) United States Patent
Stanescu et al.

(10) Patent No.: US 11,424,727 B2
(45) Date of Patent: Aug. 23, 2022

(54) GAIN-CONTROL CIRCUIT AND METHOD FOR INSTRUMENTATION AMPLIFIERS

(71) Applicant: SEMICONDUCTOR COMPONENTS INDUSTRIES, LLC, Phoenix, AZ (US)

(72) Inventors: Cornel D. Stanescu, Bucharest (RO); Cristian Marian Dinca, Bucharest (RO); Gerald William Steele, Tucson, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 133 days.

(21) Appl. No.: 16/668,557

(22) Filed: Oct. 30, 2019

(65) Prior Publication Data

US 2021/0036674 A1 Feb. 4, 2021

Related U.S. Application Data

(60) Provisional application No. 62/882,090, filed on Aug. 2, 2019.

(51) Int. Cl.
*H03F 3/45* (2006.01)
*H03G 3/30* (2006.01)

(52) U.S. Cl.
CPC .......... *H03G 3/30* (2013.01); *H03F 3/45475* (2013.01); *H03F 2200/129* (2013.01); *H03F 2200/261* (2013.01); *H03F 2203/45116* (2013.01); *H03F 2203/45526* (2013.01)

(58) Field of Classification Search
CPC ...... H03G 3/30; H03G 1/0088; H03G 1/0035; H03F 3/45475; H03F 2203/45526; H03F 2200/129; H03F 2203/45116; H03F 2200/261; H03F 3/45699; H03F 2203/45138; H03F 2203/45528
USPC ............................................ 330/252–261, 69
See application file for complete search history.

(56) References Cited

U.S. PATENT DOCUMENTS

| | | | |
|---|---|---|---|
| 8,862,253 B2* | 10/2014 | Felder | H03F 1/34 |
| | | | 700/94 |
| 10,587,234 B2* | 3/2020 | Working | H03F 3/45488 |
| 2002/0163383 A1 | 11/2002 | Schaffer et al. | |
| 2009/0027125 A1* | 1/2009 | Tansley | H03F 3/45085 |
| | | | 330/258 |

OTHER PUBLICATIONS

Analog Devices, Inc., "40 uA Micropower Instrumentation Aplifier in WLCSP Package," Data Sheet, AD8235, rev. A, 2009-2016.
(Continued)

*Primary Examiner* — Khanh V Nguyen
*Assistant Examiner* — Khiem D Nguyen
(74) *Attorney, Agent, or Firm* — Brake Hughes Bellermann LLP

(57) ABSTRACT

An instrumentation amplifier with an electronically adjustable gain is disclosed. The gain is adjusted by electronically controlling a resistance coupled to a feedback portion of the instrumentation amplifier. The resistance is adjusted by switches controlled by resistor-control signals references to a common mode voltage appearing at the input of the instrumentation amplifier. Accordingly, the instrumentation amplifier is capable of accommodating a high voltage range of common mode voltages while still providing controllable gain.

22 Claims, 8 Drawing Sheets

(56) References Cited

OTHER PUBLICATIONS

Burr-Brown Corporation, "Single Supply, MicroPower Instrumentation Amplifier," INA122, Oct. 1997.
Texas Instruments, "INA333 Micro-Power (50uA), Zero-Drift, Rail-to-Rail Out Instrumentation Amplifier," SBOS445C—Jul. 2008—revised Dec. 2015.

* cited by examiner

GAIN-CONTROL CIRCUIT AND METHOD FOR INSTRUMENTATION AMPLIFIERS

CROSS-REFERENCE TO RELATED APPLICATIONS

This application claims the benefit of U.S. Provisional Patent Application No. 62/882090, filed on Aug. 2, 2019, the entire contents of which is incorporated herein by reference.

FIELD OF THE DISCLOSURE

The present disclosure relates to instrumentation amplifiers and more specifically to a gain-control circuit and method for instrumentation amplifiers.

BACKGROUND

Instrumentation amplifiers can amplify a difference between two input signals (e.g., $V_{IN+}$, $V_{IN-}$), while rejecting signals common to both inputs (e.g., a common mode voltage, $V_{CM}$). The output ($V_{OUT}$) of the instrumentation amplifier is relative to a reference ($V_{REF}$) and therefore may be a single-ended output (e.g., $V_{REF}$=ground) or a differential output having a common mode that is shifted by the reference. For example, the equation for an instrumentation amplifier with gain (G) is given by the equation:

$$V_{OUT} = G \times (V_{IN+} - V_{IN-}) + V_{REF}$$

High voltage (HV) instrumentation amplifier can have large (>100) gains and can reject large common mode voltages (e.g., >12V). Instrumentation amplifiers may have a gain that can be set to a desired value but that, once set, is not easily controllable to other values. A need, therefore, exists for a gain-control circuit for an instrumentation amplifier to electronically control the gain of the instrumentation amplifier.

SUMMARY

In at least one aspect, the present disclosure generally describes a circuit that includes an instrumentation amplifier and a gain-control circuit. The gain-control circuit is coupled to the instrumentation amplifier and is configured to control a gain of the instrumentation amplifier to one of a plurality of possible gain values. The control is based on (i) gain-selection signals received at a plurality of gain-selection inputs and (ii) a common mode voltage that corresponds to input signals received at a positive and negative inputs of the instrumentation amplifier.

In another aspect, the present disclosure generally describes a method for adjusting a gain of an instrumentation amplifier. The method includes extracting a common-mode voltage from inputs to the instrumentation amplifier. The method further includes receiving gain-selection signals, and then based on the gain-selection signals and the common-mode voltage, a plurality of resistor-control signals are generated using a gain-decoder circuit. A resistance of an inner controlled resistor is then set based on the plurality of resistor control signals, and the gain of the instrumentation amplifier is adjusted based on the resistance of the inner controlled resistor circuit.

In another aspect, the present disclosure generally describes an adjustable gain instrumentation amplifier. The adjustable gain instrumentation amplifier includes a two-opamp instrumentation amplifier or a three-opamp instrumentation amplifier (i.e., a two or three opamp instrumentation amplifier). The adjustable gain instrumentation amplifier further includes an inner controlled resistor that is coupled to the two or three opamp instrumentation amplifier, and the gain of the two or three opamp instrumentation amplifier is based on a resistance of the inner controlled resistor. The adjustable gain instrumentation amplifier further includes a gain decoder that is coupled to the inner controlled resistor. The gain decoder is configured to control a resistance of the inner controlled resistor based on gain-selection signals that are received at a first gain-selection input and at a second gain-selection input of the gain decoder. The adjustable gain instrumentation amplifier further includes a common mode extractor that is coupled to the two or three opamp instrumentation amplifier. The common mode extractor is configured to determine a common-mode voltage from inputs to the two or three opamp instrumentation amplifier. The common-mode voltage is transmitted to the gain decoder, which is configured to offset the resistor-control signals provided to the inner controlled resistor by the common-mode voltage.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

Like reference numerals designate corresponding parts throughout the several views.

DETAILED DESCRIPTION

The present disclosure embraces an adjustable gain instrumentation amplifier circuit, in which a gain of an instrumentation amplifier can be electronically adjusted to one of a plurality of gain values via a gain-control circuit. The adjustable gain instrumentation amplifier is capable of accurately amplifying an input differential-mode voltage ($V_{DM}$), while disregarding (i.e., rejecting) an input common-mode voltage ($V_{CM}$). The disclosed circuit can operate with high voltages and is highly versatile for a user as a result of a gain that can be set or adjusted via gain-selection inputs.

Figure 1:
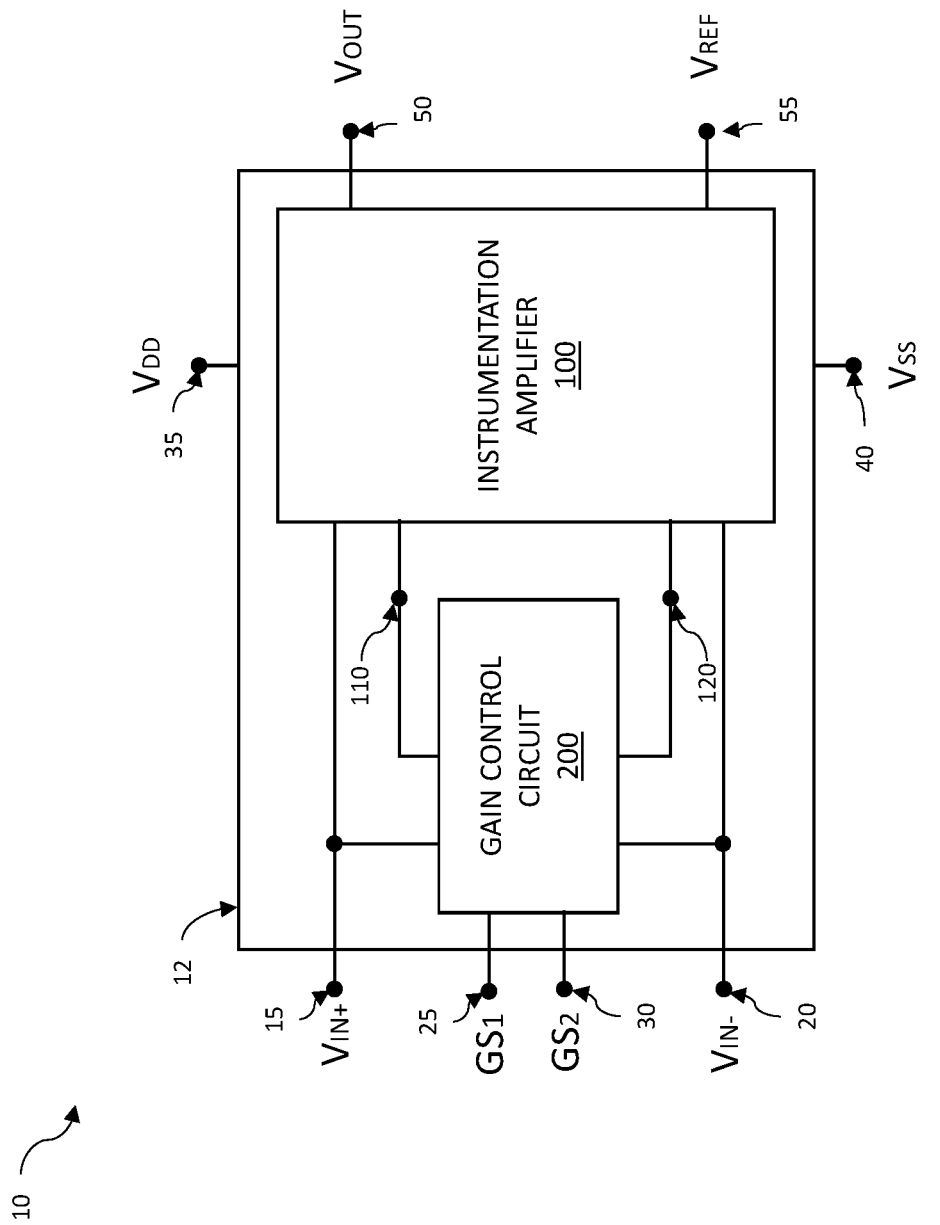
FIG. 1 depicts a block diagram of a possible adjustable gain instrumentation amplifier circuit according to an implementation of the present disclosure.

FIG. 1 depicts a block diagram of an adjustable gain instrumentation amplifier circuit 10. The adjustable gain amplifier circuit includes an instrumentation amplifier 100 that receives an input differential-mode voltage ($V_{DM}$) defined between a first (i.e., positive) input signal ($V_{IN+}$) at a first (i.e., positive) input 15 (IN+) and a second (i.e., negative) input signal ($V_{IN-}$) at a second (i.e., negative) input 20 (IN−) (i.e., $V_{DM}=V_{IN+}-V_{IN-}$). In some cases, the positive and negative input signals may share a non-zero common mode voltage ($V_{CM}$), which can be defined as an average of the first signal and the second signal (i.e., $V_{CM}=(V_{IN+}+V_{IN-})/2$). In a high voltage (HV) implementation, $V_{CM}$ may be much higher than $V_{DM}$. For example, $V_{DM}$ may be in a range of −0.75 volts (V) and +0.75 V, while $V_{CM}$ may be within a range of 1.5 V to 34.5 V for a supply voltage of 36 V. The adjustable gain instrumentation amplifier circuit 10 is configured to amplify $V_{DM}$ and reject $V_{CM}$.

The adjustable gain instrumentation amplifier circuit 10 includes an instrumentation amplifier circuit (i.e., instrumentation amplifier) 100 that is configured to amplify $V_{DM}$ by a gain (G) to produce an output signal ($V_{OUT}$) at an output terminal 50 that is relative to a reference signal ($V_{REF}$) (e.g., reference input signal) at a reference terminal 55. The gain (G) of the instrumentation amplifier 100 is adjustable by a plurality of gain-selection signals ($GS_1$, $GS_2$) at a plurality of gain-selection inputs 25, 30. The adjustable gain instrumentation amplifier circuit 10 is powered by an upper rail (i.e., positive supply) voltage ($V_{DD}$) received at a first (i.e., positive) power input 35 and a lower rail (i.e., negative supply) voltage ($V_{SS}$) received at a second (i.e., negative) power input 40. A difference between the positive voltage and the negative voltage (i.e., $V_{DD}-V_{SS}$) is a power supply voltage and for implementations of the adjustable gain instrumentation amplifier circuit may be in a range of 4 volts to 36 volts.

In some implementations, the adjustable gain instrumentation amplifier circuit 10 is contained within a discrete package. For these implementations, the inputs, outputs, and reference terminal described above may be embodied as pins of the discrete package to serve as physical, electrical connection points for other circuitry and components.

As mentioned, the particular gain of the adjustable gain instrumentation amplifier circuit 10 may depend on a particular combination of gain-selection signals ($GS_1$, $GS_2$). In other words, the instrumentation amplifier may have a discrete gain value determined (i.e., selected) by a gain-selection combination of the gain-selection signals at the gain-selector pins of the adjustable gain instrumentation amplifier circuit 10. Accordingly, the number of selectable gain values can correspond to a unique combination of gain-selection signals at the gain-selection inputs: $2^n$, where n is the number of gain-selection inputs; in the proposed circuit n=2. The adjustable gain instrumentation amplifier circuit 10 includes a gain-control circuit 200, which receives and interprets the gain-selection signals and provides a resistance between a first node 110 and a second node 120 of the instrumentation amplifier 100 to control its gain.

As shown in FIG. 1, the adjustable gain instrumentation amplifier circuit 10 includes a first gain-selection input 25 and a second gain-selection input 30. Each gain-selection input receives a corresponding gain-selection signal. The gain-selection signal at each gain-selection input is a multi-level signal. For example, each gain-selection signal can have a voltage corresponding to one of two possible levels. In other words, each gain-selection signal may be a voltage corresponding to a logical high or a voltage corresponding to a logical low. The voltage corresponding to the logical high may be the positive supply voltage ($V_{DD}$) and the voltage corresponding to the logical low may be the negative supply voltage ($V_{SS}$). The two gain-selection signals $GS_1$, $GS_2$ provide four possible gain-selection combinations of voltages (e.g., low-low, low-high, high-low, and high-high). A particular gain-selection combination can be interpreted by the gain-control circuit 200 as corresponding to a particular gain value. Based on this interpretation, the gain-control circuit 200 can provide a particular resistance to the instrumentation amplifier 100 to adjust its gain (G) to the particular gain value. Accordingly, the gain (G) may be electrically adjusted to one of four discrete values. For example, the disclosed circuit can be configured to provide possible gain values in a range between (and including) 20-200 (e.g., 20, 50, 100, and 200). The disclosure is not limited to four possible gain values; variations may exist to facilitate more (or fewer) selectable gain values. For example, more (or fewer) gain selection inputs may be provided. Additionally, or alternatively, the gain selection signal may have more (or fewer) than two possible values.

Figure 2A:
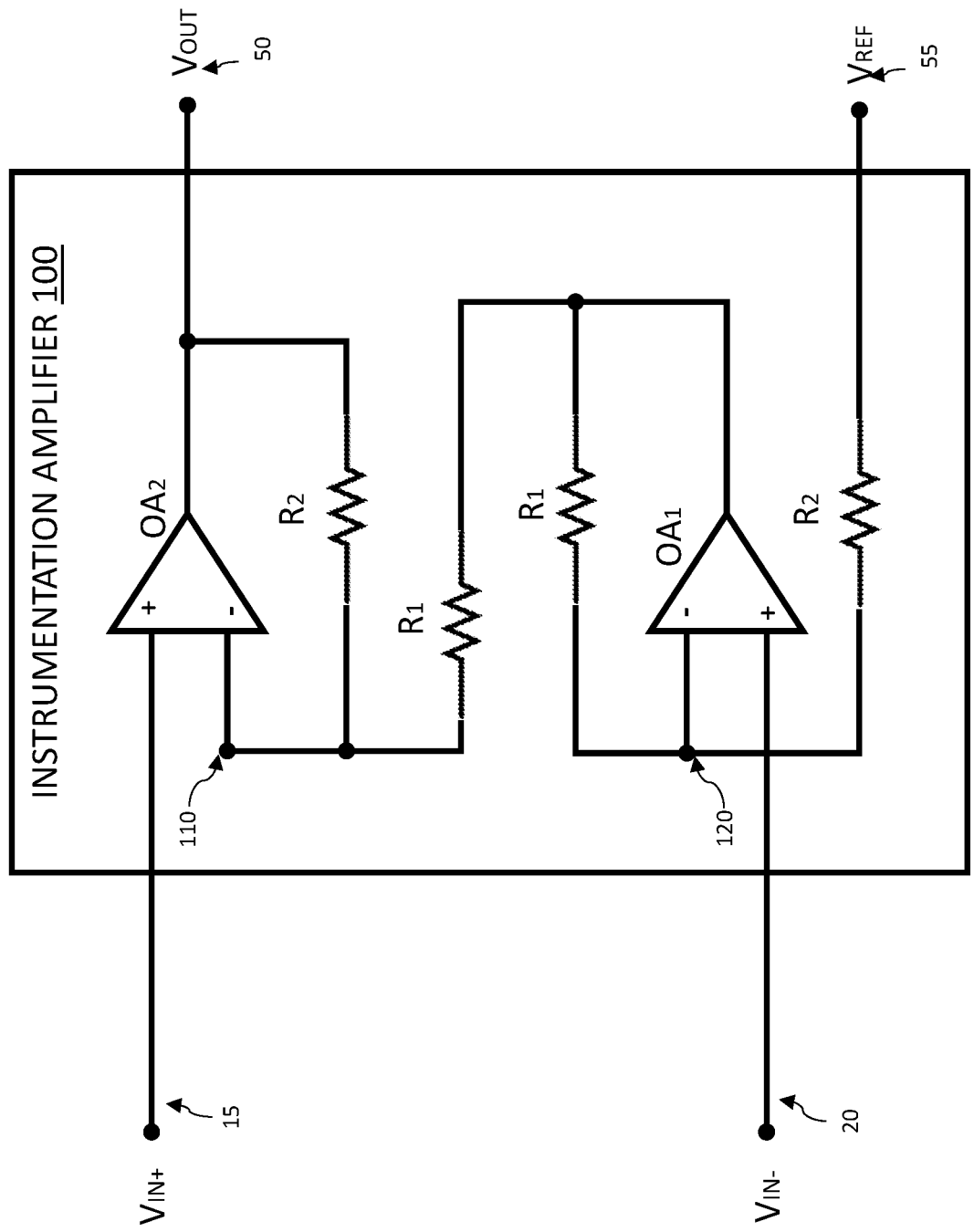
FIG. 2A schematically depicts a first instrumentation amplifier implementation that can be used with the adjustable gain instrumentation amplifier circuit of FIG. 1.

FIG. 2A schematically depicts a first possible instrumentation amplifier for the adjustable gain instrumentation amplifier circuit. The instrumentation amplifier 100 is a two-opamp instrumentation amplifier that includes a first operational amplifier (i.e., opamp) OA1 and a second opamp OA2. A non-inverting terminal of the first opamp OA1 receives the negative input signal $V_{IN-}$, while a non-inverting terminal of the second opamp OA2 receives the positive input signal $V_{IN+}$. A reference voltage, $V_{REF}$ that is applied to the reference terminal 55 of the instrumentation amplifier 100 is coupled to an inverting terminal of the first opamp OA1 via a resistor R2. The output terminal 50 of the instrumentation amplifier is coupled to the second opamp OA2. The gain of the instrumentation amplifier 100 is controlled by the resistors R1 and R2. For the implementation shown in FIG. 2A, the gain (G) is given by the equation below.

$$G = 1 + \frac{R2}{R1}$$

The gain may be adjusted by applying a resistance (i.e., inner resistor, R3) between the first node 110 and the second node 120 of the instrumentation amplifier 100. In this configuration the inner resistor R3 is placed in parallel with the two R1 resistors (i.e., of matching resistance, R1), or in other words, half of R3 is in parallel with R1 (i.e., the upper R1 as shown in FIG. 2A) and half of R3 is in parallel with R1 (i.e., lower R1 as shown in FIG. 2A). When the inner resistor is added the gain (G) is given by the equation below.

$$G = 1 + \frac{R2 \cdot (2R1 + R3)}{R1 \cdot R3}$$

Accordingly, a particular inner resistor, R3 may be coupled between the first node 110 and the second node 120 of the instrumentation amplifier 100 to set the gain to a particular value corresponding to the particular inner resistor, R3. This approach, however, does not provide a convenient means for adjusting the gain once it is set. Instead, the disclosed approach utilizes a gain-control circuit 200 to provide an adjustable resistance (i.e., an adjustable inner controlled resistor) between the first node 110 and the second node 120 to adjust the gain of the instrumentation amplifier 100. In other words, the gain-control circuit 200 can be configured to provide an electrically adjustable resistance, R3.

Figure 2B:
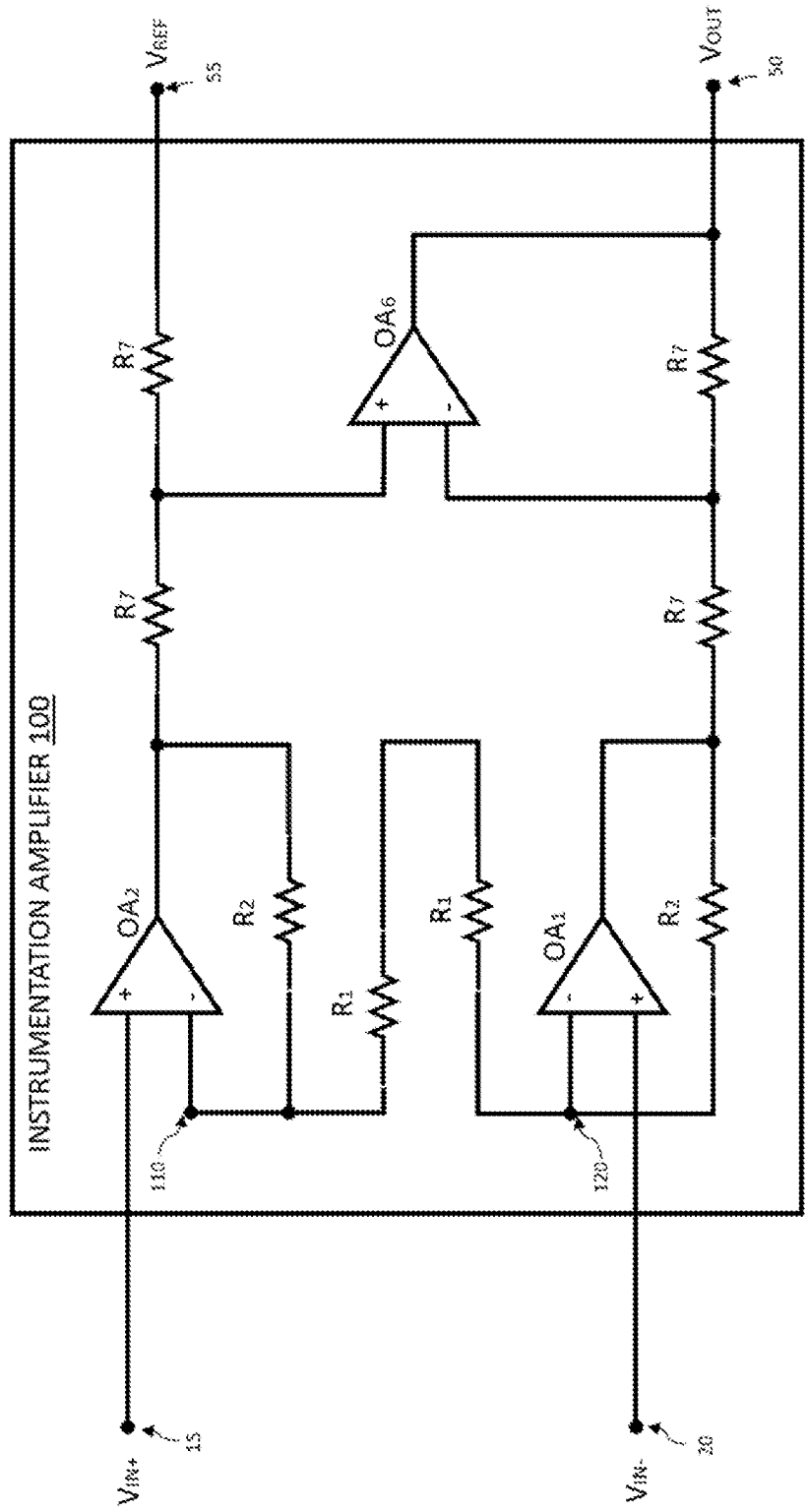
FIG. 2B schematically depicts a second instrumentation amplifier implementation that can be used with the adjustable gain instrumentation amplifier circuit of FIG. 1.

FIG. 2B schematically depicts a second possible instrumentation amplifier for the adjustable gain instrumentation amplifier circuit. The instrumentation amplifier 100 is a three-opamp instrumentation amplifier that includes a first operational amplifier (i.e., opamp) OA1 and a second opamp OA2. A non-inverting terminal of the first opamp receives the negative input signal $V_{IN-}$, while a non-inverting terminal of the second opamp OA2 receives the positive input signal $V_{IN+}$. A reference voltage, $V_{REF}$, applied to the reference terminal 55 of the instrumentation amplifier 100 is coupled to a non-inverting terminal of the third opamp OA6 via a resistor R7. The output terminal 50 of the instrumentation amplifier is coupled to an output of the third opamp OA6. Like the two-opamp instrumentation amplifier, the gain of the three-opamp instrumentation amplifier 100 can be controlled by a resistance between the first node 110 and the second node 120 of the instrumentation amplifier.

Figure 3:
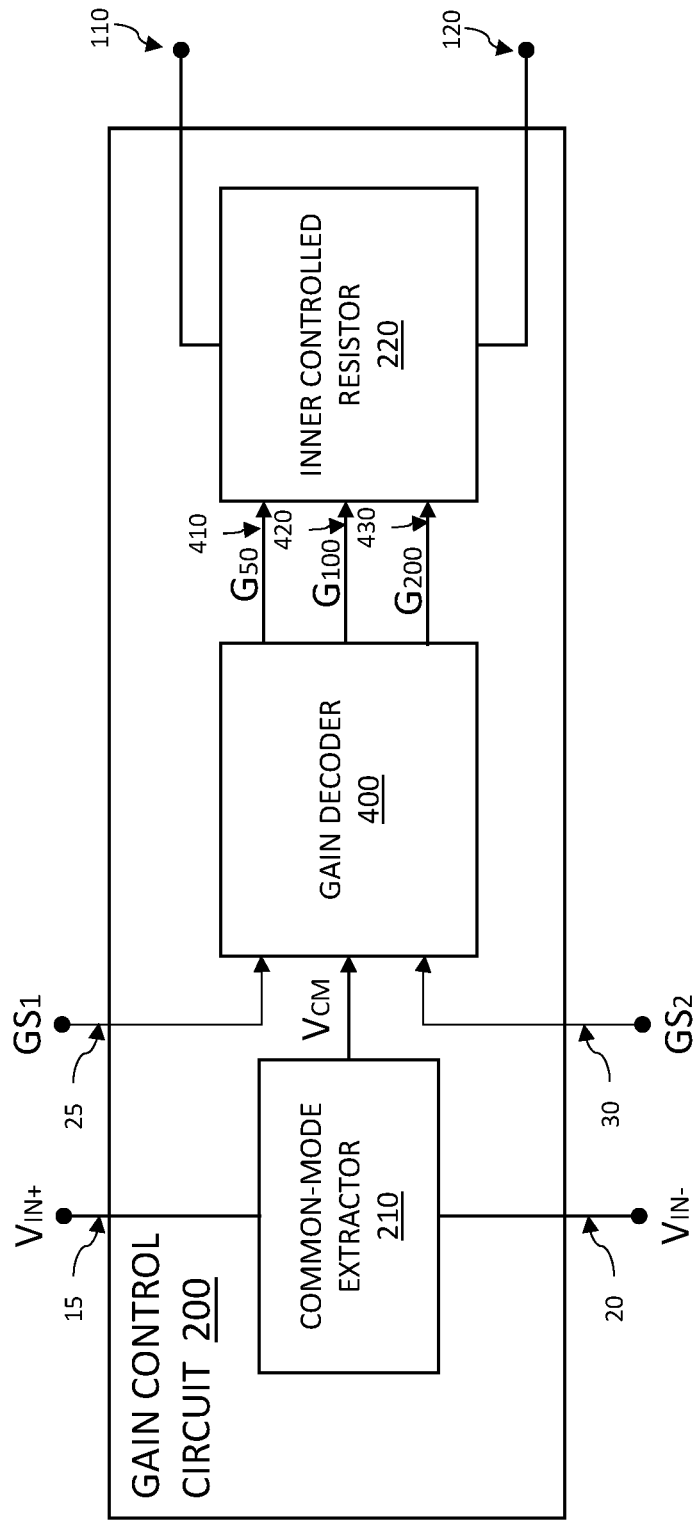
FIG. 3 depicts a block diagram of a gain-control circuit for the adjustable gain instrumentation amplifier circuit of FIG. 1.

FIG. 3 depicts a block diagram of a gain-control circuit 200 for the adjustable gain instrumentation amplifier circuit 10. The gain-control circuit includes a common-mode extractor circuit portion (i.e., common-mode extractor) 210. The common-mode extractor 210 receives as inputs, the positive input signal ($V_{IN+}$) at the positive input 15 and the negative input signal ($V_{IN+}$) at the negative input. Based on the input signals, the common-mode extractor 210 outputs a common mode voltage ($V_{CM}$), as defined above. The common mode voltage is coupled to a gain decoder circuit portion (i.e., gain decoder) 400. Additionally, the gain decoder 400 receives a first gain-selection signal ($GS_1$) at a first gain-selection input 25 and a second gain selection signal ($GS_2$) at a second gain-selection input 30.

The gain decoder 400 is configured to determine a gain value from a combination of the gain-selection signals. Based on the determined gain value, resistor-control signals (e.g., $G_{50}$, $G_{100}$, $G_{200}$) may be presented at one or more resistor-control outputs 410, 420, 430 that each correspond to a gain value. For example, if based on $GS_1$ and $GS_2$, a gain value of 200 is determined then a resistor-control signal (e.g., voltage) $G_{200}$ may be provided at the resistor-control output 430 corresponding to the gain of 200 Likewise, GS1 and GS2 voltages that correspond to gain values of 100 and 50 may cause resistor-control signals $G_{100}$ and $G_{50}$, respectively, to appear at respective resistor-control outputs 420, 410. Each resistor control signal ($G_{50}$, $G_{100}$, $G_{200}$) is based on (i.e., relative to) the common mode voltage ($V_{CM}$). To aid in understanding, an example table of signal values for the possible gain decoder implementation of FIG. 3 is provided below in TABLE 1.

to a particular gain value. While any possible combination may correspond to any possible gain value, the possible gain values (G) for the example shown in TABLE 1 are 20, 50, 100, and 200.

As shown in TABLE 1, each resistor-control signal ($G_{50}$, $G_{100}$, $G_{200}$) is considered LOW at the common-mode voltage ($V_{CM}$) and is considered HIGH at the common-mode voltage plus a switching voltage ($V_{CM}+\Delta V$). The resistor-control signals may be used to switch transistors to an ON state (e.g., HIGH=ON) or to an OFF state (e.g., LOW=OFF). Offsetting the resistor-control signals by $V_{CM}$ can help to provide proper switching levels for a range of $V_{CM}$.

As with gain-selection, the resistor-control the signals at the plurality of (e.g., three) resistor-control outputs 410, 420, 430 may combine to form an input to an inner controlled resistor 220. The particular combination of resistor-control signals may set a resistance between the first node 110 and the second node 120. As shown in TABLE 1, when all three resistor-control signals are LOW (e.g. a default state) then the inner controlled resistor can be controlled to provide resistance corresponding to a gain value of 20. A HIGH at a first resistor-control output 410 can configure the inner controlled resistor 220 to provide a resistance corresponding to a gain of 50. Likewise, a HIGH at a second resistor-control output 420 can configure the inner controlled resistor 220 to provide a resistance corresponding to a gain of 100 Likewise, a HIGH at a third resistor-control output 430 can configure the inner controlled resistor 220 to provide a resistance corresponding to a gain of 200.

In some implementations, all other resistor-control outputs are LOW when a particular resistor control output is HIGH. In other implementations, one or more of the other resistor-control outputs may be HIGH when a particular resistor control output is HIGH. For example, in TABLE 1, when the third resistor control output 430 is HIGH then the first resistor control output 410 and the second resistor-control output 420 are also HIGH. The gain values and the signals of TABLE 1 may vary in different implementations. Accordingly, while the values and the relationships listed in TABLE 1 aid in the description of the disclosure circuits and methods, they are not intended to be limiting.

Figure 4:
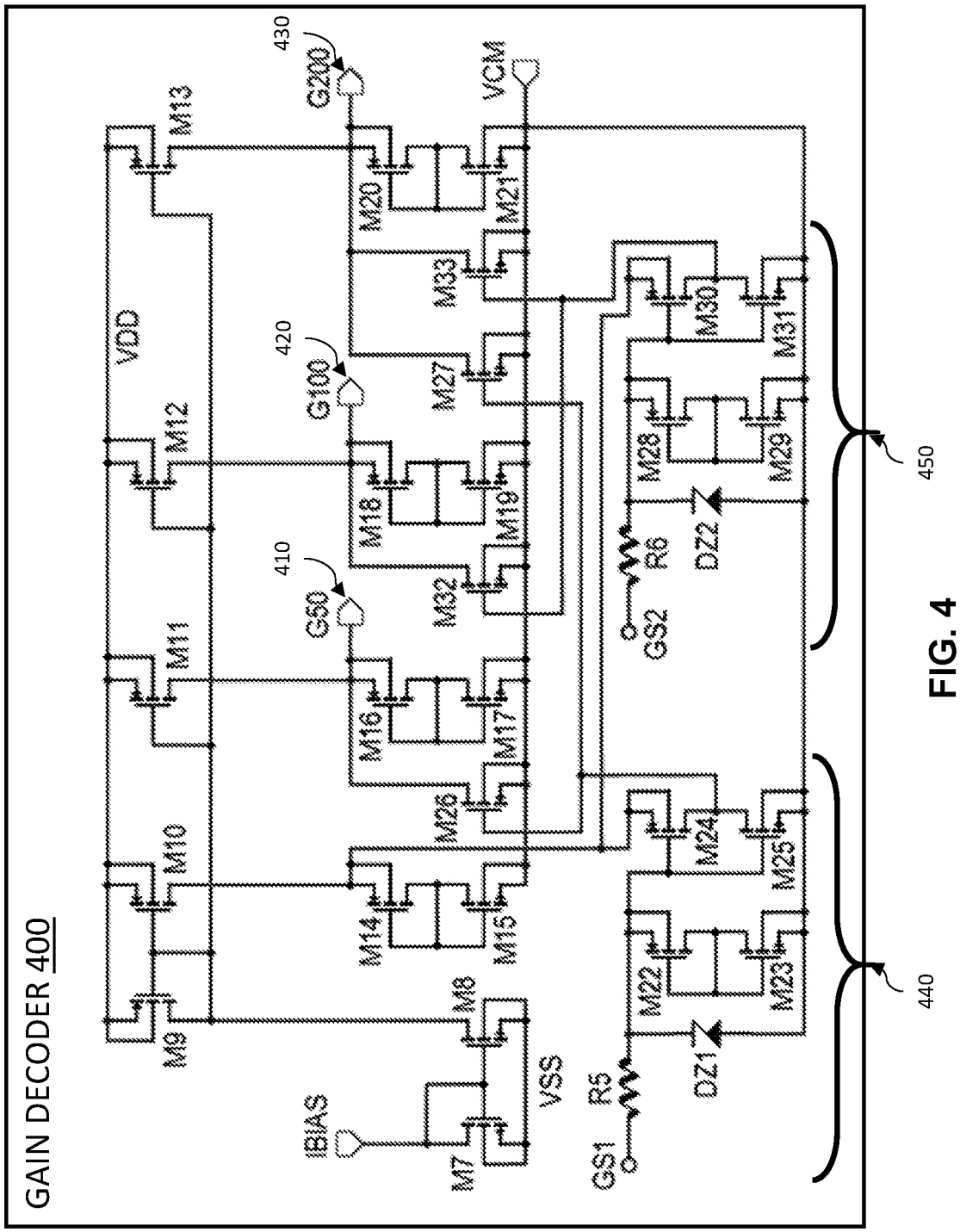
FIG. 4 depicts a detailed schematic of the gain decoder circuit for the gain-control circuit of FIG. 3.

FIG. 4 depicts a detailed schematic of the gain decoder 400 for the gain-control circuit 200 of FIG. 3. The output of the first resistor control output 410 is coupled to a pair of diode-connected transistors M16, M17 and a switching transistor M26. When the switching transistor M26 is in an ON condition (i.e., conducting), the first resistor control output 410 is coupled to the common mode voltage input (i.e., $G_{50}=V_{CM}$). When the switching transistor M26 is in an OFF condition then the first resistor control output 410 is coupled to $V_{CM}$ via the pair of diode connected transistors

TABLE 1

EXAMPLE SIGNALS ASSOCIATED WITH GAIN VALUES (G)

| G | $GS_1$ | $GS_2$ | $G_{50}$ | $G_{100}$ | $G_{200}$ |
|---|---|---|---|---|---|
| 20 | LOW ($V_{SS}$) | LOW ($V_{SS}$) | LOW ($V_{CM}$) | LOW ($V_{CM}$) | LOW ($V_{CM}$) |
| 50 | HIGH ($V_{DD}$) | LOW ($V_{SS}$) | HIGH ($V_{CM} + \Delta V$) | LOW ($V_{CM}$) | LOW ($V_{CM}$) |
| 100 | LOW ($V_{SS}$) | HIGH ($V_{DD}$) | LOW ($V_{CM}$) | HIGH ($V_{CM} + \Delta V$) | LOW ($V_{CM}$) |
| 200 | HIGH ($V_{DD}$) | HIGH ($V_{DD}$) | HIGH ($V_{CM} + \Delta V$) | HIGH ($V_{CM} + \Delta V$) | HIGH ($V_{CM} + \Delta V$) |

As shown in TABLE 1, each gain-selection signal (i.e., $GS_1$ or $GS_2$) is considered LOW at the low rail voltage ($V_{SS}$) and is considered HIGH at the high rail voltage ($V_{DD}$). The gain-selection signals across each (i.e., both) gain-selection inputs form a (HIGH/LOW) combination that corresponds M16, M17. The pair of diode-connected transistor M16, M17 act as a voltage source because they are coupled to current mirrors (e.g., M7+M8, M9+M10, M11, M12, or M3), which provide them with a bias current ($I_{BIAS}$). In this condition, the first resistor control output 410 is $V_{CM}$ plus the voltage drop across the pair of diode connected transistors (i.e., the switching voltage ΔV).

The output of the second resistor control output 420 is coupled to a pair of diode-connected transistors M18, M19 and a switching transistor M32. When the switching transistor M32 is in an ON condition (i.e., conducting), the second resistor control output 420 is coupled to the common mode voltage input (i.e., $G_{100}=V_{CM}$). When the switching transistor M32 is in an OFF condition then the second resistor control output 420 is coupled to $V_{CM}$ via the pair of diode connected transistors M18, M19. The pair of diode-connected transistor M18, M19 act as a voltage source because they are coupled to current mirrors, which provide them with a bias current ($I_{BIAS}$). In this condition, the second resistor control output 420 is $V_{CM}$ plus the voltage drop across the pair of diode connected transistors (i.e., the switching voltage ΔV).

The switching transistors M26 and M32 are controlled by voltages corresponding to the first gain-selection signal ($GS_1$) and the second gain-selection signal ($GS_2$), respectively. The voltages produced by a first gain-decoder input circuit 440 and a second gain-decoder input circuit 450. Because both circuits operate similarly, only the first gain-decoder input circuit 440 will be described in detail.

The first gain-decoder input circuit 440 includes a large input resistance R5 to prevent loading circuitry providing the first gain-selection signal ($GS_1$) and to help bias diode-connected transistors M22, M23 when a HIGH signal received. Additionally, the first gain input circuit includes a diode device (e.g., Zener diode) DZ1 for over-voltage protection. The first gain input circuit also includes an inverter formed from transistors M24 and M25. When $GS_1$ is HIGH, the input to the inverter is pulled high and the first gain input circuit outputs a LOW voltage. When $GS_1$ is LOW, input of the inverter is pulled low and the first gain input circuit outputs a HIGH voltage.

The output of the third resistor control output 430 is coupled to a pair of diode-connected transistors M20, M21 and a first switching transistor M27 and a second switching transistor M33. When either the first witching transistor M27 or the second switching transistor M33 is an ON condition (i.e., conducting), the third resistor control output 430 is coupled to the common mode voltage input (i.e., $G_{200}=V_{CM}$). When the first switching transistor M27 and the second switching transistor M33 are both in an OFF condition then the third resistor control output 430 is coupled to $V_{CM}$ via the pair of diode connected transistors M20, M21. The pair of diode-connected transistor M20, M21 act as a voltage source because they are coupled to current mirrors, which provide them with a bias current ($I_{BIAS}$). In this condition, the third resistor control output 430 is $V_{CM}$ plus the voltage drop across the pair of diode connected transistors (i.e., the switching voltage ΔV).

In the operation of the gain decoder of FIG. 4, a LOW $GS_1$ configures M26 and M27 in an ON condition, and a HIGH $GS_1$ configures M26 and M27 in an OFF condition. Likewise, a LOW $GS_2$ configures M32 and M33 in an ON condition, and a HIGH $GS_2$ configures M32 and M33 in an OFF condition. When M26 is in an OFF condition $G_{50}$ is a HIGH level (i.e., $V_{CM}+\Delta V$), when M32 is in an OFF condition $G_{100}$ is the HIGH level, and when M27 and M33 are both in an OFF condition $G_{200}$ is the HIGH level.

Figure 5A:
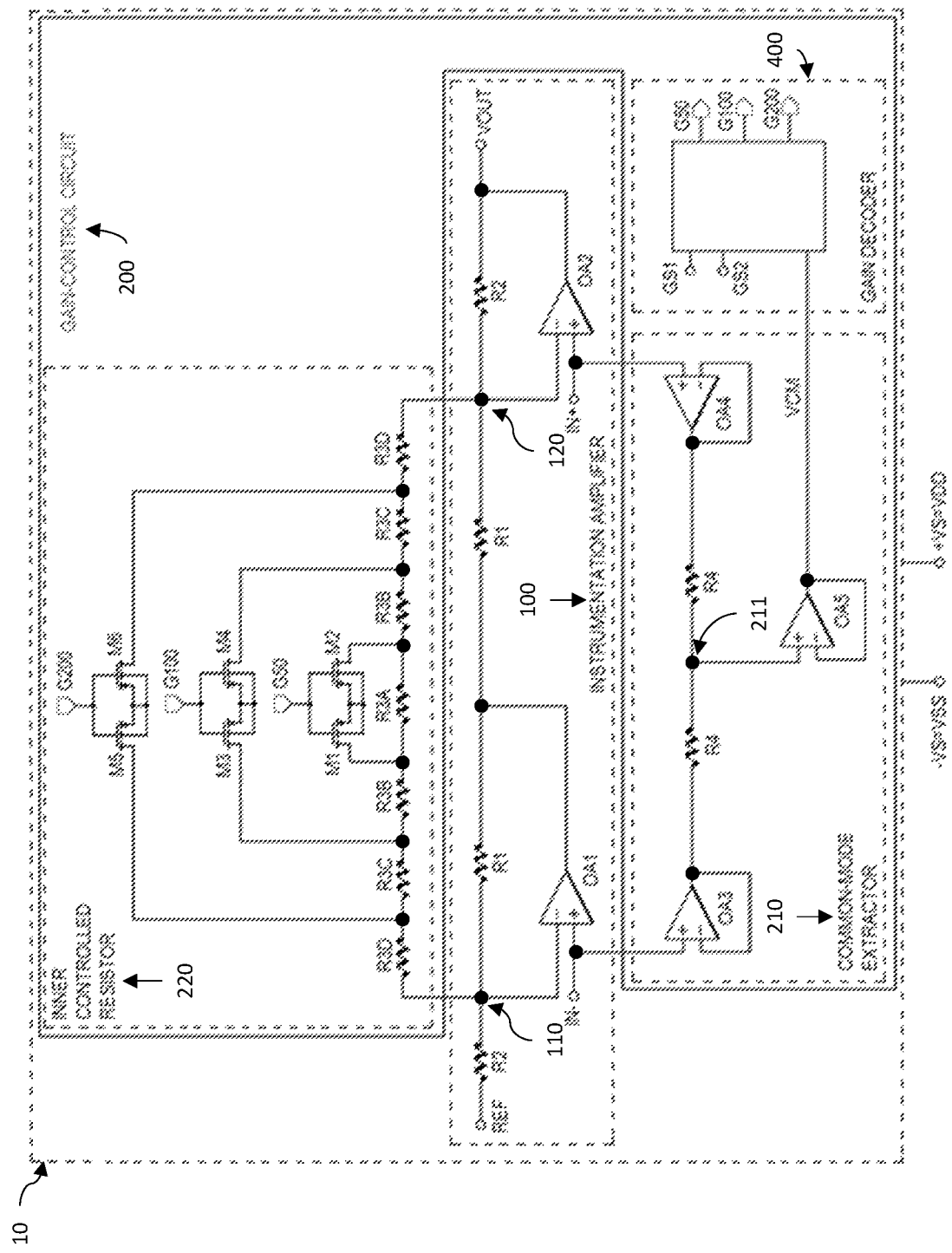
FIG. 5A depicts a detailed schematic of the adjustable gain instrumentation amplifier of FIG. 1 according to a first possible implementation.

FIG. 5A depicts a detailed schematic of the adjustable gain instrumentation amplifier 10 of FIG. 1 according to a first possible implementation. The instrumentation amplifier 100, the common-mode extractor 210, the gain decoder 400, and the inner controlled resistor 220 portions of the adjustable gain instrumentation amplifier 10 are separated with dotted lines. Additionally, the portions included in the gain-control circuit 200 are outlined with a solid outline. As shown, the common-mode extractor is coupled to the positive input of the instrumentation amplifier (IN+) and to a negative input of the instrumentation amplifier (IN−). The input signals (e.g., voltages) are buffered by opamps OA3, OA4 and create a voltage across a pair of matched resistors R4. The pair of matched resistors forms a voltage divider that produces the common-mode voltage ($V_{CM}$) at a voltage-divider node 211 between the pair of resistors R4, which can be in a range of 100-500 kilo-ohms. The $V_{CM}$ is buffered by an opamp OA5 and coupled to the gain decoder 400. The circuit senses $V_{CM}$ and uses this as a virtual ground for the resistor control signals $G_{50}$, $G_{100}$, and $G_{200}$ so that $V_{CM}$ may change without negatively affecting the operation of the circuit.

The resistor control signals from the gain decoder are coupled to the inner controlled resistor 220. The inner control resistor includes a plurality of series-connected resistors and a plurality of switches. The series connected resistors are coupled between the first node 110 and the second node 120 to provide a resistance (R3) that sets the gain of the instrumentation amplifier. Each switch operates as a single-pole single-throw (SPST) switch and each switch is connected in parallel to one or more of the series-connected resistors so that when a particular switch is closed (i.e., in an ON condition), a portion of the plurality of resistors is shorted by the switch. In this way, the resistance between the first node 110 and the second node 120 may be electronically adjusted by adjusting the ON/OFF states of the switches. The disclosure is not limited to any particular number of resistors or switches and the resistors and switches may be arranged variously.

The inner controlled resistor 220 of FIG. 5A is one possible implementation in which each switch is embodied as a pair metal oxide semiconductor field effect transistors (MOSFETs). The gate terminals and the source terminals of the two MOSFETS are coupled together to form a dual MOSFET bidirectional switch. For example, a first resistor switch may include the transistors M1 and M2, which can be controlled to an open (OFF) or shorted (ON) condition (i.e. state) by resistor control signal $G_{50}$. A second resistor switch may include the transistors M3 and M4, which can be controlled to an open (OFF) or a shorted (ON) condition by resistor control signal G100. A third resistor switch may include the transistors M5 and M6, which can be controlled to an open (OFF) or a shorted (ON) condition by resistor control signal G200.

The resistors in the plurality of series-connected resistors can be are arranged symmetrically around a central resistor so that the central resistor, R3A, is coupled at each outer side by resistors of equal value, R3B. The resistors, R3B, are coupled at each outer side by resistors of equal value, R3C. The resistors, R3C, are coupled at each outer side by resistors of equal value, R3D. In a default condition, all switches may be OFF so that R3=R3A+2R3B+2R3C+2R3D, which can correspond to a minimum gain value (e.g., G=20). In other words a maximum inner resistance (R3) may correspond to a minimum gain of the instrumentation amplifier. To aid in understanding, an example table of resistance values for the possible inner controlled resistor implementation is provided below in TABLE 2.

TABLE 2

EXAMPLE INNER RESISTANCES ASSOCIATED WITH GAIN VALUES

| GAIN (G) | G50 | G100 | G200 | INNER RESISTANCE (R3) |
|---|---|---|---|---|
| 20  | LOW ($V_{CM}$) | LOW ($V_{CM}$) | LOW ($V_{CM}$) | R3A + 2R3B + 2R3C + 2R3D |
| 50  | HIGH ($V_{CM}$ + ΔV) | LOW ($V_{CM}$) | LOW ($V_{CM}$) | 2R3B + 2R3C + 2R3D |
| 100 | LOW ($V_{CM}$) | HIGH ($V_{CM}$ + ΔV) | LOW ($V_{CM}$) | 2R3C + 2R3D |
| 200 | HIGH($V_{CM}$ + ΔV) | HIGH($V_{CM}$ + ΔV) | HIGH($V_{CM}$ + ΔV) | 2R3D |

The resistor switches in the inner controlled resistor 220 are arranged so that the second resistor switch and the first resistor switch are shorted when the third resistor switch is closed (i.e., ON). Accordingly, in the example shown in TABLE 2 the (ON/OFF) state of the first resistor switch and the (ON/OFF) state of the second resistor switch do not significantly affect the inner resistance when the third resistor switch is ON (i.e., 2R3D). Accordingly, in TABLE 2 for G=200, G50 and G100 could be LOW ($V_{CM}$) without loss of function, and variations such as these are within the scope of the disclosure. Additionally, more or fewer possible gain values. For example, the plurality of possible gain values may be four or more discrete gain values in a range of about 20 to 200.

The gain-control circuit 200 advantageously consumes very little power. For example, the gain-control circuit can consume 10 percent or less of a total power consumed by the adjustable gain instrumentation amplifier circuit 10.

The values of resistors R1, R2, and consecutively, R3, are chosen based on the input noise voltage specification of the high-voltage instrumentation amplifier. One possible value for R1 is 4 kilo-ohms, which is large enough to be implemented with precision in layout, but still low in terms of white-noise voltage contribution.

The value of the switches resistance in the "ON" state is linked to the transistor transconductance in strong inversion. Considering $k_N$ is the intrinsic transconductance of the MOSFET (e.g., HV NMOS) transistors, W and L are the channel dimensions, and $V_{TP}$ is the overdrive provided by the circuit (i.e., an overdrive equal with the threshold voltage for the HV PMOS transistor). A switch of M1 and M2, can be described by the equation:

$$R_{DSM1,2} = 2R_{DSM1} = \frac{2}{gm_1} = \frac{2}{k_N \cdot \frac{w_1}{L_1} \cdot |V_{TP}|}$$

The fact that the switches are built in symmetrical pairs, with the sources and p-well connected together may be proficient in handling the (+/−) differential voltage which appears across R3 (i.e., a voltage almost identical with the differential input voltage $V_{IN+}$−$V_{IN-}$). Also, by using this connection, the switches can handle a negative voltage close to the threshold voltage of a "p-n" diode (e.g., the parasitic p-well/source-to-drain diode). Over temperature, this voltage is less than 400 mV and more than 375 mV. This can give a maximum differential voltage on R3 equal with ±0.75V, which corresponds to a maximum ±15V or 30V peak-to-peak output swing over a large temperature domain (−40° C. to +125° C.) for a gain of 20. Thus, the instrumentation amplifier 100 is configured to amplify a differential mode voltage ($V_{DM}$) corresponding to input signals with a voltage difference between −0.75V and +0.75V.

Figure 5B:
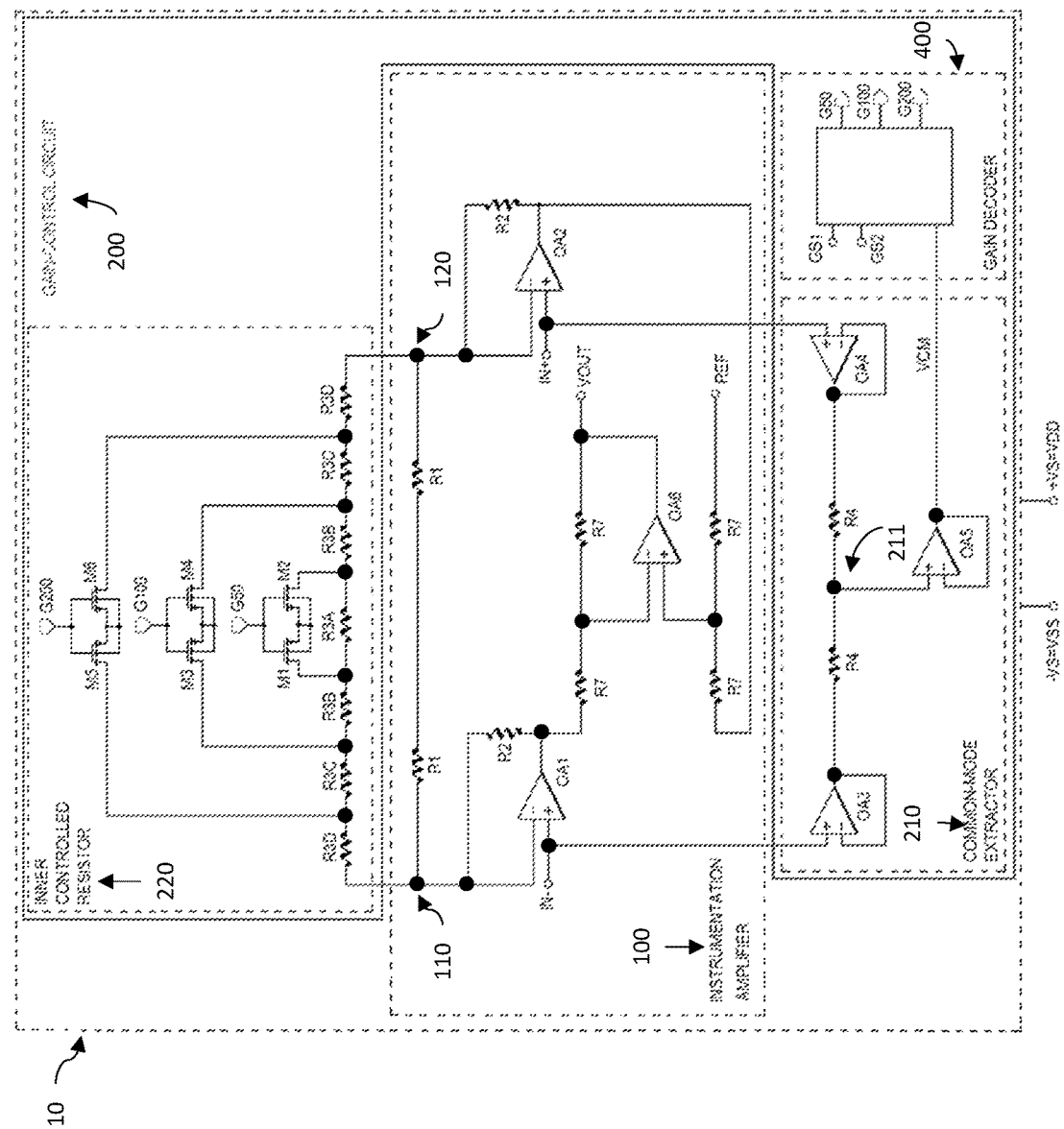
FIG. 5B depicts a detailed schematic of the adjustable gain instrumentation amplifier of FIG. 1 according to a second possible implementation.

FIG. 5B illustrates a detailed schematic of the adjustable gain instrumentation amplifier 10 of FIG. 1 according to a second possible implementation. The implementation shown in FIG. 5B is identical as that shown in FIG. 5A except for the instrumentation amplifier 100. For the implementation of FIG. 5A the instrumentation amplifier 100 is implemented as a two-opamp instrumentation amplifier. For the implementation of FIG. 5B, the instrumentation amplifier 100 is implemented as a three-opamp instrumentation amplifier. The three-opamp implementation may be used for applications that required a large common mode rejection ratio (CMRR) and a good (e.g., fast) transient response for changes (stepwise changes) in $V_{CM}$. In some circumstances the three-opamp instrumentation amplifier provides a larger CMRR and a better (e.g., faster) transient response than the two-opamp instrumentation amplifier.

The three opamp implementation of the instrumentation amplifier is different from the two opamp implementation of the instrumentation amplifier in a variety of ways. The three-opamp instrumentation amplifier includes an additional opamp (OA6) and four additional resistors (R7), all of the same resistance. The additional opamp and resistors can be sized and arranged in such a way so as gain values G (e.g., 20, 50, 100, and 200) correspond to the inner resistance values in the same way as described for the two-opamp instrumentation amplifier implementation (e.g., see TABLE 2).

Figure 6:
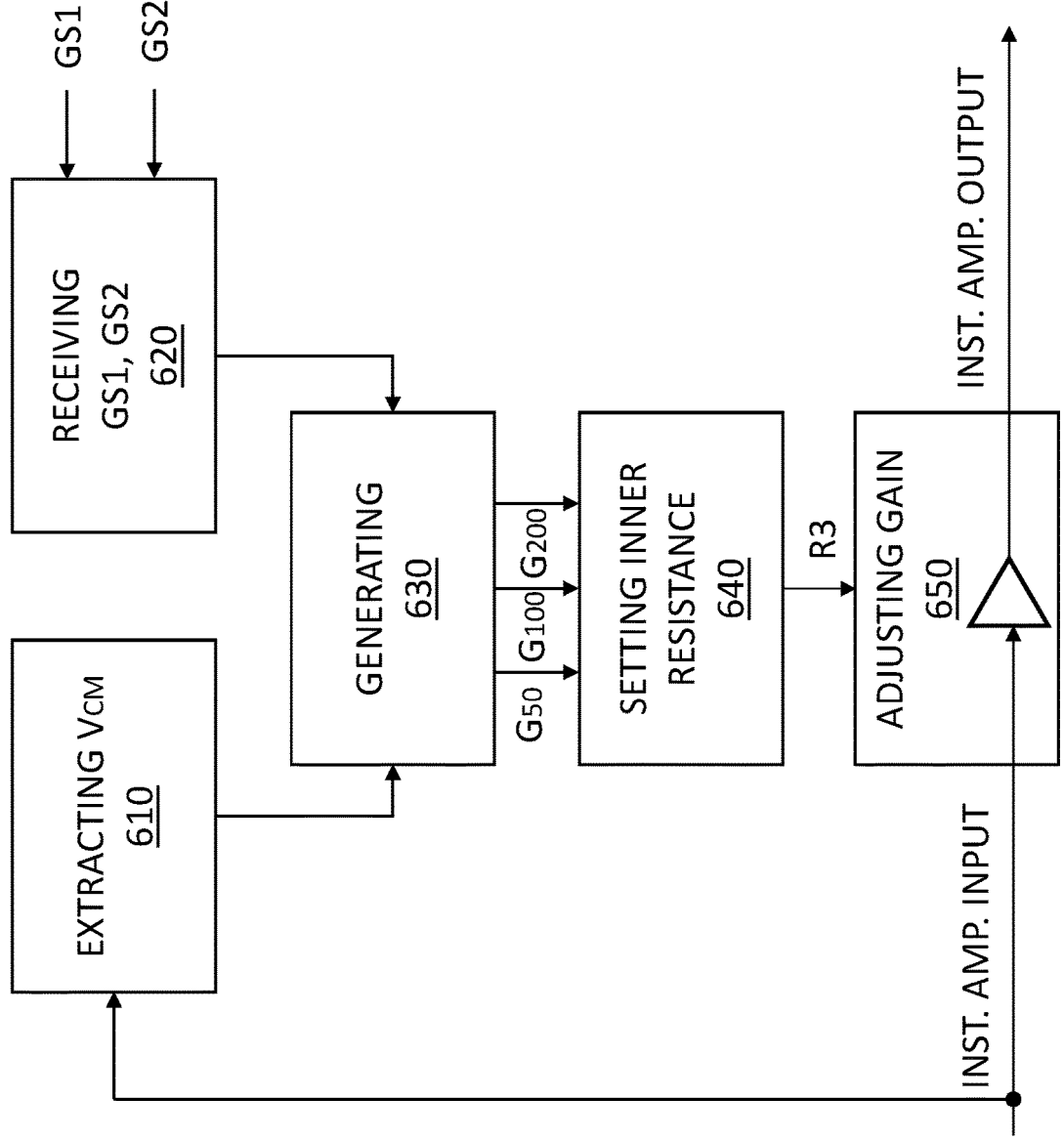
FIG. 6 is a flow chart of a method for adjusting a gain of an instrumentation amplifier according to a possible implementation of the disclosure.

FIG. 6 is a flow chart of a method for adjusting a gain of an instrumentation amplifier according to a possible implementation of the disclosure. The method includes extracting 610 a common-mode voltage ($V_{CM}$) from inputs (e.g. $V_{IN+}$, $V_{IN-}$) to the instrumentation amplifier. The extraction may be accomplished using a common mode extractor circuit 210 that includes a voltage divider. The method also includes receiving 620 gain selection signals (e.g., GS1, GS2). In some implementations, the gain selection signals may be provided by user, sensor, or processor controlled circuitry and based on a lookup table of gain selection signals according to gain values (or vice versa). The method also includes generating 630, using a gain-decoder circuit, a plurality of resistor-control signals ($G_{50}$, $G_{100}$, $G_{200}$) based on the gain selection signals and the common-mode voltage. In a possible implementation, the resistor-control signals may be a HIGH voltage or a LOW voltage that are offset by the common-mode voltage. The method also includes setting 640 a resistance of an inner controller resistor circuit based on the plurality of resistor control signals. In a possible implementation, the inner controlled resistor circuit includes a bank of series connected resistors, portions of which can be shorted by switches to set or adjust the resistance. Finally the method includes adjusting 650 the gain of the instrumentation amplifier based on the resistance of the inner controlled resistor circuit. In one possible implementation, the instrumentation amplifier is a two opamp instrumentation amplifier and the resistance of the inner controlled resistor is coupled between inverting inputs of the two opamps. In another possible implementation, the instrumentation amplifier is a three opamp instrumentation amplifier and the resistance of the inner controlled resistor is coupled between inverting inputs of two (i.e., OA1, OA2) of the three opamps, where the three opamps include a first opamp (OA1), a second opamp (OA2), and a third opamp (OA6).

In the specification and/or figures, typical embodiments have been disclosed. The present disclosure is not limited to such exemplary embodiments. For example, the techniques and methods of the present disclosure may be applied to low voltages in much the same was as described herein for high voltages. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A circuit, comprising:
   an instrumentation amplifier; and
   a gain-control circuit coupled to the instrumentation amplifier that includes:
   a common-mode extractor circuit coupled to a positive input and a negative input of the instrumentation amplifier and configured to output a common mode voltage;
   a gain decoder circuit configured to output a plurality of resistor-control signals based, in part, on the common mode voltage from the common-mode extractor circuit; and
   an inner controlled resistor circuit configured to generate a resistance according to the plurality of resistor-control signals from the gain decoder circuit, the resistance coupled to the instrumentation amplifier.

2. The circuit according to claim 1, wherein:
   the inner controlled resistor circuit includes a bank of resistors, a gain of the instrumentation amplifier corresponding to a resistance of the bank of resistors; and
   the gain decoder circuit is configured to output the plurality of resistor-control signals to based on the common mode voltage from the common-mode extractor circuit and on gain-selection signals at a plurality of gain-selection inputs to the gain decoder circuit.

3. The circuit according to claim 2, wherein:
   the instrumentation amplifier is powered by a negative supply voltage ($V_{SS}$) and a positive supply voltage ($V_{DD}$);
   each of the plurality of gain-selection inputs receives gain-selection signals of either $V_{SS}$ or $V_{DD}$ to define a particular gain-selection combination of voltages across the plurality of gain-selection inputs; and
   the gain decoder circuit is configured to output a particular combination of resistor-control signals across a plurality of resistor-control outputs, the particular combination corresponding to the particular gain-selection combination of voltages.

4. The circuit according to claim 3, wherein:
   the inner controlled resistor circuit includes a plurality of switches that are each coupled in parallel to a different set of resistors in the bank of resistors so that when one or more of the plurality of switches is in an ON condition, a portion of the bank of resistors is shorted and a resistance of the bank of resistors corresponds to a portion of the bank of resistors not shorted; and
   each of the plurality of switches is coupled to one of the plurality of resistor-control outputs so that ON conditions of the plurality of switches correspond to a particular combination of resistor-control voltages across the plurality of resistor-control outputs.

5. The circuit according to claim 3, wherein:
   each resistor-control signal in a particular combination of resistor-control signals is offset by the common mode voltage ($V_{CM}$).

6. The circuit according to claim 5, wherein the common mode voltage ($V_{CM}$) is within a range of about 1.5 volts to 34.5 volts for a supply voltage of 36 volts.

7. The circuit according to claim 2, wherein the common-mode extractor circuit includes:
   a voltage divider circuit coupled to the positive input of the instrumentation amplifier and the negative input of the instrumentation amplifier, the output of the voltage divider circuit corresponding to $V_{CM}$.

8. The circuit according to claim 2, wherein:
   the instrumentation amplifier is a two-opamp instrumentation amplifier that includes a first opamp and a second opamp, and
   the bank of resistors of the inner controlled resistor circuit is coupled between an inverting input of the first opamp and an inverting input of the second opamp.

9. The circuit according to claim 2, wherein:
   the instrumentation amplifier is a three-opamp instrumentation amplifier that includes a first opamp, a second opamp, and a third opamp, and
   the bank of resistors of the inner controlled resistor circuit is coupled between an inverting input of the first opamp and an inverting input of the second opamp.

10. The circuit according to claim 1, wherein the gain-control circuit consumes 10 percent or less of a total power consumed by the circuit.

11. The circuit according to claim 1, wherein the instrumentation amplifier is configured to amplify a differential mode voltage (VDM) corresponding to input signals having a voltage difference within −0.75 volts and +0.75 volts.

12. The circuit according to claim 2, wherein the gain is controlled to four or more discrete gain values in a range of about 20 to 200.

13. A method for adjusting a gain of an instrumentation amplifier, the method comprising:
   extracting a common-mode voltage from inputs to the instrumentation amplifier;

receiving gain-selection signals;
generating, using a gain-decoder circuit, a plurality of resistor-control signals based on the gain-selection signals and the common-mode voltage;
setting a resistance of an inner controlled resistor circuit based on the plurality of resistor-control signals; and
adjusting the gain of the instrumentation amplifier based on the resistance of the inner controlled resistor circuit.

14. The method according to claim 13, wherein the instrumentation amplifier is a two-opamp instrumentation amplifier.

15. The method according to claim 13, wherein the instrumentation amplifier is a three-opamp instrumentation amplifier.

16. The method according to claim 13, wherein the inner controlled resistor circuit comprises a plurality of series-connected resistors and a plurality of switches, each switch of the plurality of switches connected in parallel to one or more of the resistors in the plurality of series connected resistors.

17. The method according to claim 16, wherein the setting a resistance of the inner controlled resistor circuit based on the plurality of resistor-control signals comprises:
controlling one or more of the switches in an ON condition based on the resistor-control signals; and
shorting a portion of the series-connected resistors using the one or more switches in the ON condition so that the resistance of the inner controlled resistor corresponds to resistors in the plurality of series-connected resistors that are not shorted by the one or more switches in the ON condition.

18. The method according to claim 13, wherein extracting a common mode voltage from inputs to the instrumentation amplifier; comprises:
applying a positive input terminal and a negative input terminal of the instrumentation amplifier to a voltage divider; and
tapping the voltage divider to obtain the common mode voltage.

19. The method according to claim 13, wherein each of the plurality of resistor-control signals is a HIGH voltage or a LOW voltage, the HIGH voltage and the LOW voltage offset by the common mode voltage.

20. The method according to claim 19, wherein the common mode voltage is in a range of about 1.5 volts to about 34.5 volts for a supply voltage of 36 volts.

21. An adjustable gain instrumentation amplifier, comprising:
a two or three opamp instrumentation amplifier;
an inner controlled resistor coupled to the two or three opamp instrumentation amplifier, the gain of the two or three opamp instrumentation amplifier based on a resistance of the inner controlled resistor;
a gain decoder coupled to the inner controlled resistor and configured to provide resistor-control signals to the inner controlled resistor to control the resistance of the inner controlled resistor based on gain-selections signals received at a first gain-selection input and a second gain-selection input of the gain decoder; and
a common mode extractor coupled to the two or three opamp instrumentation amplifier and configured to determine a common-mode voltage from inputs to the two or three opamp instrumentation amplifier, the common-mode voltage transmitted to the gain decoder, which is configured to offset the resistor-control signals provided to the inner controlled resistor by the common-mode voltage.

22. The adjustable gain instrumentation amplifier according to claim 21, configured to:
provide a gain of 20, 50, 100, or 200 based on four possible combinations gain-selection signals at the first gain-selection input and the second gain-selection input.

* * * * *